United States Patent
Akiyama et al.

(10) Patent No.: US 7,855,127 B2
(45) Date of Patent: Dec. 21, 2010

(54) METHOD FOR MANUFACTURING SEMICONDUCTOR SUBSTRATE

(75) Inventors: Shoji Akiyama, Gunma (JP); Yoshihiro Kubota, Gunma (JP); Atsuo Ito, Gunma (JP); Koichi Tanaka, Gunma (JP); Makoto Kawai, Gunma (JP); Yuuji Tobisaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 41 days.

(21) Appl. No.: 12/010,711

(22) Filed: Jan. 29, 2008

(65) Prior Publication Data
US 2008/0194078 A1    Aug. 14, 2008

(30) Foreign Application Priority Data
Feb. 8, 2007    (JP)    ............. 2007-029484

(51) Int. Cl.
*H01L 21/30*    (2006.01)
(52) U.S. Cl. .......... 438/458; 438/455; 438/459; 438/474; 438/795; 438/798; 257/55; 257/63; 257/65; 257/E31.049; 257/E29.297; 257/E21.182; 257/21.207
(58) Field of Classification Search ........ 438/455, 438/458, 459; 257/55, 63, 65, E29, 297, 257/E21.182, 207
See application file for complete search history.

(56) References Cited

U.S. PATENT DOCUMENTS

| | | |
|---|---|---|
| 2004/0092051 A1 | 5/2004 | Currie et al. |
| 2005/0042842 A1 | 2/2005 | Lei et al. |
| 2005/0196937 A1 * | 9/2005 | Daval et al. ............ 438/455 |
| 2006/0054891 A1 * | 3/2006 | Chu et al. ............ 257/65 |

(Continued)

FOREIGN PATENT DOCUMENTS

WO    WO 2004/027858 A1    4/2004

OTHER PUBLICATIONS

Dey et al. "Pure germanium epitaxial growth on thin strained silicon-germanium graded layers on bulk silicon substrate for high-mobility channel metal-oxide-semiconductor field-effect transistors", J. of Electronic Materials, vol. 35, No. 8, 2006.*

(Continued)

*Primary Examiner*—Savitri Mulpuri
*Assistant Examiner*—Yasser A Abdelaziez
(74) *Attorney, Agent, or Firm*—Oliff & Berridge, PLC

(57) ABSTRACT

A method for manufacturing a semiconductor substrate including: epitaxially growing a silicon germanium (SiGe) film on a silicon (Si) substrate by a chemical vapor deposition method; subjecting a heat treatment to the SiGe film at a temperature of not less than 700° C. and not more than 1200° C.; implanting hydrogen ions into a surface of the SiGe film; subjecting a surface activation treatment to a main surface of at least one of the SiGe film and a support substrate; bonding main surfaces of the SiGe film and the support substrate at a temperature of not less than 100° C. and not more than 400° C.; and applying an external impact to a bonding interface between the SiGe film and the support substrate to delaminate the SiGe crystal along a hydrogen ion implanted interface of the SiGe film, thereby forming a SiGe thin film on the main surface of the support substrate.

12 Claims, 2 Drawing Sheets

U.S. PATENT DOCUMENTS

2006/0099773 A1* 5/2006 Maa et al. .................. 438/455

OTHER PUBLICATIONS

Nakatsuru et al. ("Growth of high quality Ge epitaxial layer on Si(100) substrate using ultra thin Si0.5Ge0.5 buffer", Material Research Soc. Symposium Proc. vol. 891, 2006).*

Taraschi et al. ("Ultrathin strained Si-on-Insulator and SiGe-on-Insulator created using low temperature wafer bonding and metastable stop layers", J. of Electrochemical Society, 151 (1) G47-G56, 2004).*

Nakatsuru et al., *Growth of High Quality Ge Epitaxial Layer On Si(100) Substrate Using Ultra Thin $Si_{0.5}Ge_{0.5}$ Buffer*, Mater. Res. Soc. Symp. Proc., vol. 891 (2006).

People R., "Physics and Applications of $Ge_xSi_{1-x}$/Si Strained-Layer Heterostructures," Sep. 1986, IEEE Journal of Quantum Electronics, vol. QE-22, No. 9, pp. 1696-1710.

Halbwax M. et al., "UHV-CVD Growth and Annealing of Thin Fully Relaxed Ge Films on (001)Si," 2005, Optical Materials, vol. 27, pp. 822-826.

Summons to attend oral proceedings issued in European Application No. 08001964.9-1235 / 1956639 dated Sep. 3, 2010.

* cited by examiner

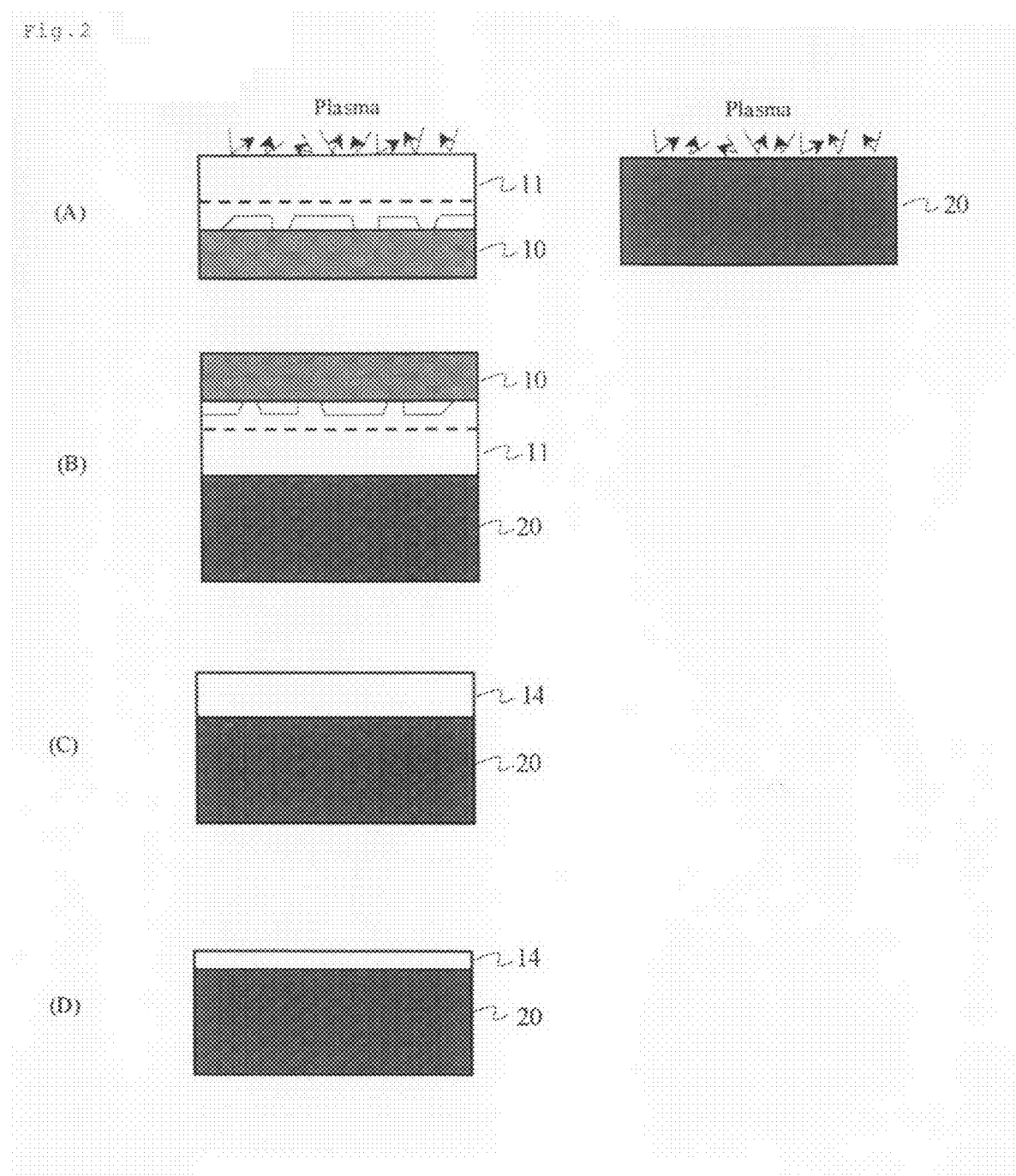

METHOD FOR MANUFACTURING SEMICONDUCTOR SUBSTRATE

BACKGROUND OF THE INVENTION

1. Field of the Invention

The present invention relates to a method for manufacturing a semiconductor substrate comprising a germanium-based epitaxial film such as germanium (Ge), silicon germanium (SiGe) or the like on a foreign substrate.

2. Description of the Related Art

While the use of SOI (Silicon-On-Insulator) substrates has previously been known as a technique of increasing the carrier mobility in semiconductor devices to enhance the processing speed, the use of GeOI (Germanium-On-Insulator) substrates has recently been proposed. The reason is that the carrier mobility in the Ge crystal is higher than that in the Si crystal, with the electron mobility being about twice higher, and the hole mobility being about four times higher, which is advantageous for designing high-speed operating semiconductor devices.

To epitaxially grow a Ge film on a foreign substrate, one technique is known which comprises depositing on a Si substrate a number of $Si_{1-x}Ge_x$ layers with slightly increasing Ge concentrations, and ultimately obtaining a Ge layer not containing Si (see, R. People, "*Physics and applications of $Ge_xSi_{1-x}/Si$ strained layer structures*", IEEE Journal of Quantum Electronics, QE-22, 1696 (1986)). In this technique, the Ge concentration in the $Si_{1-x}Ge_x$ layers is gradually increased in order to prevent lattice defects referred to as misfit dislocations, which are introduced by direct epitaxial growth of a Ge film on a Si substrate due to a difference of about 4% between the lattice constants of Si and Ge.

The resulting Ge layer is then implanted hydrogen ions, and the hydrogen ion implanted Ge layer is bonded to a support substrate such as a silicon wafer with an oxide film thereon. The bonded substrate is then subjected to a heat treatment at a temperature of not less than 400° C. and not more than 600° C., causing minute hydrogen cavities referred to as microcavities to be formed in the hydrogen ion implanted interface to delaminate the substrate, resulting in a GeOI substrate.

This technique, however, requires the epitaxial growth of $Si_{1-x}Ge_x$ many times, and hence increases the manufacturing costs. Most of all, it is difficult to sufficiently reduce the lattice defects introduced in the Ge epitaxial layer. Moreover, the technique entails a heat treatment subsequent to delamination in order to increase the bonding strength of the bonding interface between the support substrate and the Ge layer, in which heat treatment is performed at a relatively high temperature of not less than 800 and not more than 900° C. Considering that the melting point of Ge is 918° C., the technique cannot be regarded as being suitable to the industrial production method.

These problems can certainly be avoided by using a Ge substrate as an epitaxial substrate. However, Ge substrates are very difficult to increase in diameter, and because Ge is a rare element, the costs can consequently be very high, making the use of Ge substrates unrealistic.

SUMMARY OF THE INVENTION

The present invention was accomplished in view of these problems. The object of the invention is to provide a method for manufacturing a semiconductor substrate whereby a high-quality Ge-based epitaxial film can be obtained in a large area, using a relatively simple technique.

In order to solve the aforementioned problems, a method for manufacturing a GeOI (Germanium-On-Insulator) substrate in accordance with the present invention comprises the steps of: (A) epitaxially growing a germanium (Ge) film on a silicon (Si) substrate by a chemical vapor deposition method; (B) subjecting a heat treatment to the Ge film at a temperature of not less than 700° C. and not more than 900° C.; (C) implanting hydrogen ions into a surface of the Ge film; (D) subjecting a surface activation treatment to a main surface of at least one of the Ge film and the support substrate; (E) bonding the main surfaces of the Ge film and the support substrate; and (F) applying an external impact to a bonding interface between the Ge film and the support substrate to delaminate the Ge crystal along a hydrogen ion implanted interface of the Ge film, thereby forming a Ge thin film on the main surface of the support substrate.

Preferably, the step A comprises, prior to the epitaxial growth of the Ge film, growing a buffer layer composed of silicon germanium (SiGe) with a thickness of 50 nm or less on the main surface of the Si substrate.

A method for manufacturing a SGOI (Silicon Germanium-On-Insulator) substrate in accordance with the present invention comprises the steps of: (A) epitaxially growing a silicon germanium (SiGe) film on a silicon (Si) substrate by a chemical vapor deposition method; (B) subjecting a heat treatment to the SiGe film at a temperature of not less than 700° C. and not more than 1200° C.; (C) implanting hydrogen ions into a surface of the SiGe film; (D) subjecting a surface activation treatment to a main surface of at least one of the SiGe film and the support substrate; (E) bonding the main surfaces of the SiGe film and the support substrate; and (F) applying an external impact to a bonding interface between the SiGe film and the support substrate to delaminate the SiGe crystal along a hydrogen ion implanted interface of the SiGe film, thereby forming a SiGe thin film on the main surface of the support substrate.

Preferably, the Ge content of the SiGe film is 10% or more by molar ratio.

Each of the above-defined methods for manufacturing GeOI and SGOI substrates, the step (c) may comprise, prior to the hydrogen ion implantation, the step of subjecting a surface treatment to the Ge film or the SiGe film so that an Rms value of the surface roughness thereof becomes 0.5 nm or less.

Preferably, the surface treatment step is performed by chemical mechanical polishing.

Preferably, the bonding at the step (E) is performed at a temperature of not less than 100° C. and not more than 400° C.

In the present invention, the support substrate may be a silicon wafer with an oxide film thereon, a quartz substrate, a glass substrate, a sapphire substrate, a silicon carbide (SiC) substrate, an alumina substrate, or an aluminum nitride substrate.

According to the present invention, a silicon wafer or the like that provides a large-diameter substrate is used as a substrate for epitaxial growth, and then a film obtained by epitaxially growing a Ge-based crystal on that substrate is transferred onto an insulating support substrate through a bonding method. Low-cost GeOI or SGOI substrates can thus be provided.

BRIEF DESCRIPTION OF THE DRAWINGS

FIG. 2 is a flowchart for use in explaining a method for manufacturing a semiconductor substrate in accordance with the present invention.

DETAILED DESCRIPTION OF THE PREFERRED EMBODIMENTS

Figure 1:
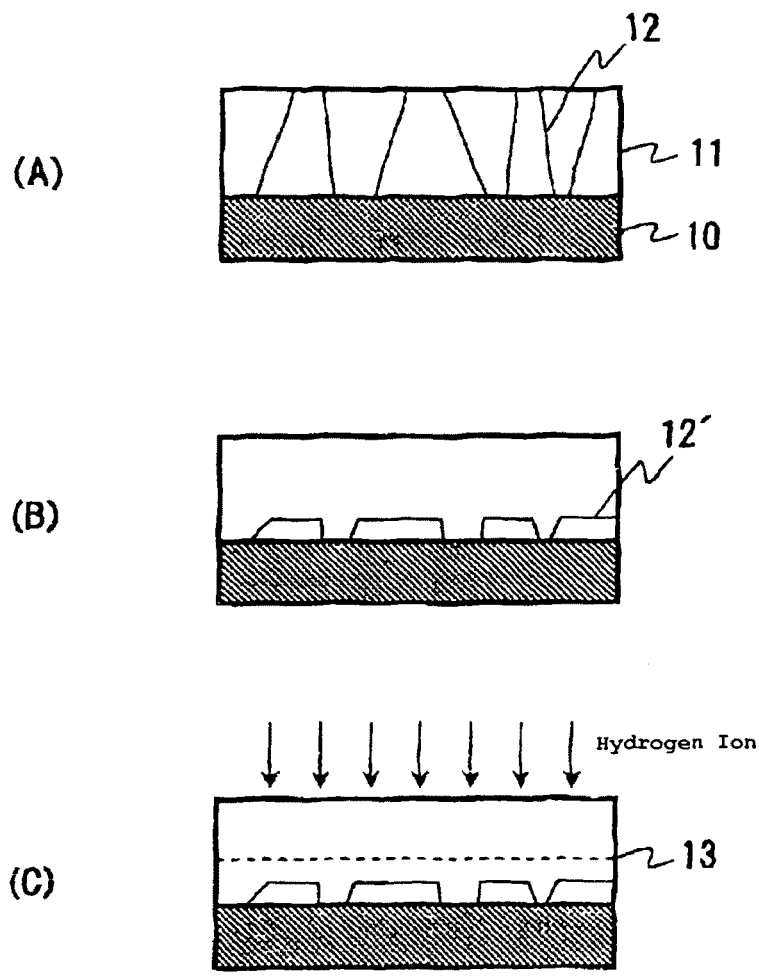
FIG. 1 is a flowchart for use in explaining a method for manufacturing a semiconductor substrate in accordance with the present invention.

Referring to the drawings, an example of a process for manufacturing a semiconductor substrate according to the present invention will be described below. In the following embodiments, the support substrate is described as a silicon wafer with an oxide film on a main surface thereof; however, the invention is not limited to this example, and the support substrate may also be a quartz substrate, glass substrate, sapphire substrate, silicon carbide (SiC) substrate, alumina substrate, aluminum nitride substrate, or the like.

First Embodiment

GeOI Substrate

FIGS. 1 (A) to (C) and FIGS. 2 (A) to (D) are flowcharts for explaining an example of a process for manufacturing a semiconductor substrate according to the present invention. In this embodiment, an example of a process for manufacturing a GeOI substrate is explained. In each of these flowcharts, reference numeral 10 denotes a silicon (Si) substrate for epitaxially growing germanium (Ge) by a chemical vapor deposition (CVD) method. The Si substrate 10 is, for example, a generally commercially available Si substrate grown by the CZ (Czochralski) method. The electrical properties of the Si substrate, such as the conductivity type, an electrical characteristic value such as specific resistivity and the like, as well as the crystal orientation and the crystal size thereof are suitably selected depending on the device design values, the process, and the like of the device to which the Ge epitaxial film produced in the method of the present invention is applied.

A Ge film is epitaxially grown on a main surface of the Si substrate 10 through a CVD method by introducing a high-purity gas of germane ($GeH_4$) into a vacuum atmosphere, using hydrogen gas as a carrier gas. In the Ge epitaxial film 11, high-density defects (threading dislocations) 12 are introduced from the interface between the Ge epitaxial film 11 and the Si substrate 10 (FIG. 1 (A)). It is known that when the Ge epitaxial film 11 containing threading dislocations is subjected to a suitable heat treatment, and an energy to cause motion of the threading dislocations 12 is applied to the heat-treated film, the threading dislocations 12 are changed into dislocation-loop defects near the Si substrate interface (see M. Halbwax et al., "*UHV-CVD growth and annealing of thin fully relaxed Ge films on* (001) *Si*", Optical Materials, 27 (2005), pp. 822-825).

Thus, in the present invention, in order to gather the dislocations in the Ge epitaxial film 11 near the interface of the Ge epitaxial film 11 and the Si substrate 10 (denoted by reference numeral 12'), a heat treatment is performed at a temperature of not less than 650° C. and not more than 900° C. (preferably not less than 700° C. and not more than 900° C.) (FIG. 1 (B)). The atmospheric gas employed in the heat treatment is either oxygen gas or an inert gas such as nitrogen, argon or the like, or a mixture of these gases.

Hydrogen ions are then implanted into a surface of the Ge epitaxial film 11, thereby forming a hydrogen ion implanted layer near the interface between the Ge epitaxial film 11 and the Si substrate 10 (FIG. 1 (C)). As a result of the hydrogen ion implantation, such an ion implanted layer (damage layer) is formed at a predetermined depth (average ion implantation depth L) from the surface of the Ge epitaxial film 11, thus forming an ion implanted interface 13.

The ion implantation conditions may be determined depending on the thickness of the Ge thin film to be removed. For example, the average ion implantation depth L may be 0.5 µm or less, and ions may be implanted at a dose of $1 \times 10^{16}$ to $5 \times 10^{17}$ atoms/cm$^2$ and at acceleration voltage is set to 50 to 100 keV.

Note that when a SiGe mixed crystal buffer layer with a thickness of 50 nm or less is formed prior to the epitaxial growth of Ge on the Si substrate 10, a Ge film with a low defect level can be obtained. The buffer layer may have a composition of, for example, $Ge_{0.88}Si_{0.12}$, so as to enable coherent growth of a Ge epitaxial film. Moreover, prior to the hydrogen ion implantation, the Ge epitaxial film 11 is preferably subjected to a surface treatment by a technique such as chemical mechanical polishing (CMP) so that the Rms value of the surface roughness thereof becomes 0.5 nm or less. This increases the bonding adhesion at a subsequent step.

A main surface (bonding surface) of at least one of the Ge epitaxial film 11 thus having the ion implanted layer and an insulating support substrate 20 that will later be a handle wafer is subjected to a plasma treatment or ozone treatment for the purpose of surface cleaning, surface activation, and the like (FIG. 2 (A)). Note that such a surface treatment is performed in order to remove organic substances on the surface to be bonded, increase the OH group on the surface to enable surface activation, and the like. For this reason, a surface treatment may not necessarily be performed on both the bonding surfaces of the Ge epitaxial film 11 and support substrate 20, and may be performed on the bonding surface of only one of them.

The main surfaces of the Ge epitaxial film 11 and the support substrate 20 subjected to such a surface treatment are appressed against and bonded to each other with their surfaces being determined as the joint surfaces (FIG. 2 (B)). As described above, because at least one main surface (bonding surface) of the Ge epitaxial film 11 and the support substrate 20 has been activated through a surface treatment such as plasma treatment or ozone treatment, a bonding strength sufficiently high to withstand subsequent mechanical delamination and mechanical polishing can be achieved even when they are bonded at room temperature. Accordingly, a high-temperature heat treatment (around 1000° C.) such as that required in the so-called "SOITEC method" is not necessary.

When a higher bonding strength is desired, bonding may be performed at a temperature of not less than 100° C. and not more than 400° C., or a heat treatment at a temperature of not less than 100° C. and not more than 400° C. may be performed subsequent to bonding at room temperature. The reason for which the aforementioned heat treatment is set to 400° C. or less in the present invention is that a heat treatment at a temperature over 400° C. causes minute cavities referred to as microcavities to be formed in the hydrogen ion implanted interface, making rough the surface of the Ge thin film after delamination.

When the support substrate 20 is a quartz substrate, the upper limit of the heat-treatment temperature is preferably set to 350° C. The heat-treatment temperature is so set in consideration of the difference between the thermal expansion coefficients of Si and quartz and the amount of strain due to this difference, as well as the amount of strain and the thicknesses of the Si substrate 10 and the quartz substrate. When the Si substrate 10 and the quartz substrate are substantially equal in thickness, there is a large difference between the thermal expansion coefficients of Si ($2.33 \times 10^{-6}$) and quartz ($0.6 \times 10^{-6}$). For this reason, a heat treatment at a temperature over 350°

C. may cause cracking due to thermal strains, delamination of the bonding surface, and the like because of a difference in rigidity between the two substrates. In extreme cases, the Si substrate or quartz substrate may be broken. Accordingly, the upper limit of the heat-treatment temperature is selected to be 350° C., and more preferably not less than 100° C. and not more than 300° C.

An external impact is then applied to the bonding interface, causing the Ge epitaxial film to be delaminated along the hydrogen ion implanted interface 13, thus obtaining a Ge thin film 14 (FIG. 2 (C)). The surface of the Ge thin film 14 is subsequently subjected to a final surface treatment (for example, CMP) to remove the damage caused by the hydrogen ion implantation, thus resulting in a GeOI substrate having the Ge thin film 14 on the surface thereof (FIG. 2 (D)).

Second Embodiment

SGOI Substrate

The second embodiment describes an example of a process for manufacturing a SGOI substrates. Since the process is basically the same as that described in the first embodiment, it will be explained again with reference to FIGS. 1 (A) to (C) and FIGS. 2 (A) to (D). In this embodiment, reference numeral 11 in the figures denotes a SiGe epitaxial film obtained by epitaxial growth of silicon germanium (SiGe) by a chemical vapor deposition (CVD) method.

Also in the SiGe epitaxial film 11, high-density defects (threading dislocations) 12 are introduced from the interface between the SiGe epitaxial film 11 and the Si substrate 10 (FIG. 1 (A)). In order to gather the dislocations in the SiGe epitaxial film 11 near the interface of the epitaxial film 11 and the Si substrate 10 (denoted by reference numeral 12'), a heat treatment is performed at a temperature of not less than 650° C. and not more than 1200° C. (preferably not less than 700° C. and not more than 1200° C.) (FIG. 1 (B)).

The atmospheric gas used in the heat treatment is either oxygen gas or an inert gas such as nitrogen, argon or the like, or a mixture of these gases.

Hydrogen ions are then implanted into a surface of the SiGe epitaxial film 11, thereby forming a hydrogen ion implanted layer near the interface between the SiGe epitaxial film 11 and the Si substrate 10 (FIG. 1 (C)). An ion implanted interface 13 is thus formed at a predetermined depth (average ion implantation depth L) from the surface of the SiGe epitaxial film 11.

In order to suppress the generation of dislocations near the interface between the SiGe epitaxial film 11 and the Si substrate 10 at a low level, the composition of the SiGe epitaxial film is preferably set such that the Ge content is 10% or more by molar ratio. Moreover, as previously explained in the first embodiment, prior to the hydrogen ion implantation, the SiGe epitaxial film 11 is preferably subjected to a surface treatment by a technique such as chemical mechanical polishing (CMP) so that the Rms value of the surface roughness thereof becomes 0.5 nm or less. This increases the bonding adhesion at a subsequent step.

A main surface (bonding surface) of at least one of the SiGe epitaxial film 11 thus having the ion implanted layer and an insulating support substrate 20 that will later be a handle wafer is subjected to a plasma treatment or ozone treatment for the purpose of surface cleaning, surface activation, and the like (FIG. 2 (A)). The main surfaces of the SiGe epitaxial film 11 and the support substrate 20 are then appressed against and bonded to each other with their surfaces being determined as the joint surfaces (FIG. 2 (B)).

As explained above, when a higher bonding strength is desired, bonding may be performed at a temperature of not less than 100° C. and not more than 400° C., or a heat treatment at a temperature of not less than 100° C. and not more than 400° C. may be performed subsequent to bonding at room temperature.

An external impact is then applied to the bonding interface, causing the SiGe epitaxial film to be delaminated along the hydrogen ion implanted interface 13, thus obtaining a SiGe thin film 14 (FIG. 2 (C)). The surface of the SiGe thin film 14 is subsequently subjected to a final surface treatment (for example, CMP) to remove the damage caused by the hydrogen ion implantation, thus resulting in a SGOI substrate having the SiGe thin film 14 on the surface thereof (FIG. 2 (D)).

INDUSTRIAL APPLICABILITY

The present invention provides a semiconductor substrate having a high-quality Ge-based epitaxial film in a large area, using a relatively simple technique.

What is claimed is:

1. A method for manufacturing a semiconductor substrate comprising the steps of:
   (A) epitaxially growing a silicon germanium (SiGe) film on a silicon (Si) substrate by a chemical vapor deposition method;
   (B) subjecting a heat treatment to the SiGe film at a temperature of not less than 700° C. and not more than 1200° C.;
   (C) implanting hydrogen ions into a surface of the SiGe film;
   (D) subjecting a surface activation treatment to a main surface of at least one of the SiGe film and a support substrate;
   (E) bonding main surfaces of the SiGe film and the support substrate at a temperature of not less than 100° C. and not more than 400° C.; and
   (F) applying an external impact to a bonding interface between the SiGe film and the support substrate to delaminate the SiGe crystal along a hydrogen ion implanted interface of the SiGe film, thereby forming a SiGe thin film on the main surface of the support substrate.

2. The method for manufacturing a semiconductor substrate according to claim 1, wherein the Ge content of the SiGe film is 10% or more by molar ratio.

3. The method for manufacturing a semiconductor substrate according to claim 1, wherein the step C comprises, prior to the hydrogen ion implantation, a step of subjecting a surface treatment to the SiGe film so that an Rms value of a surface roughness thereof becomes 0.5 nm or less.

4. The method for manufacturing a semiconductor substrate according to claim 2, wherein the step C comprises, prior to the hydrogen ion implantation, a step of subjecting a surface treatment to the SiGe film so that an Rms value of a surface roughness thereof becomes 0.5 nm or less.

5. The method for manufacturing a semiconductor substrate according to claim 3, wherein the surface treatment step is performed by chemical mechanical polishing.

6. The method for manufacturing a semiconductor substrate according to claim 4, wherein the surface treatment step is performed by chemical mechanical polishing.

7. The method for manufacturing a semiconductor substrate according to claim 1, wherein the support substrate is a silicon wafer with an oxide film thereon, a quartz substrate, a glass substrate, a sapphire substrate, a silicon carbide (SiC) substrate, an alumina substrate, or an aluminum nitride substrate.

8. The method for manufacturing a semiconductor substrate according to claim 2, wherein the support substrate is a silicon wafer with an oxide film thereon, a quartz substrate, a glass substrate, a sapphire substrate, a silicon carbide (SiC) substrate, an alumina substrate, or an aluminum nitride substrate.

9. The method for manufacturing a semiconductor substrate according to claim 1, wherein the step A comprises growing a buffer layer composed of silicon germanium (SiGe) with a thickness of 50 nm or less on the main surface of the silicon (Si) substrate, and then epitaxially growing the silicon germanium (SiGe) film, which Ge content is 100% on the buffer layer grown on the silicon (Si) substrate by a chemical vapor deposition method; and the step (B) comprises subjecting a heat treatment to the SiGe film at a temperature of not less than 700° C. and not more than 900° C.

10. The method for manufacturing a semiconductor substrate according to claim 9, wherein the step C comprises, prior to the hydrogen ion implantation, subjecting a surface treatment to the Ge film so that an Rms value of a surface roughness thereof becomes 0.5 nm or less.

11. The method for manufacturing a semiconductor substrate according to claim 10, wherein the surface treatment to the Ge film is performed by chemical mechanical polishing.

12. The method for manufacturing a semiconductor substrate according to claim 9, wherein the support substrate is a silicon wafer with an oxide film thereon, a quartz substrate, a glass substrate, a sapphire substrate, a silicon carbide (SiC) substrate, an alumina substrate or an aluminum nitride substrate.

* * * * *